United States Patent
Yang et al.

(10) Patent No.: US 10,205,443 B2
(45) Date of Patent: Feb. 12, 2019

(54) PHASE INTERPOLATOR AND CLOCK GENERATING METHOD

(71) Applicant: Realtek Semiconductor Corp., HsinChu (TW)

(72) Inventors: Fangjie Yang, Hunan Province (CN); Chuan-Ping Tu, Hsinchu County (TW)

(73) Assignee: Realtek Semiconductor Corp., HsinChu (TW)

( * ) Notice: Subject to any disclaimer, the term of this patent is extended or adjusted under 35 U.S.C. 154(b) by 0 days.

(21) Appl. No.: 15/721,750

(22) Filed: Sep. 30, 2017

(65) Prior Publication Data
US 2018/0109247 A1   Apr. 19, 2018

(30) Foreign Application Priority Data

Oct. 14, 2016  (CN) .......................... 2016 1 0897942

(51) Int. Cl.
| H03K 5/135 | (2006.01) |
|---|---|
| H04L 7/00 | (2006.01) |
| H04L 7/033 | (2006.01) |
| H04L 27/01 | (2006.01) |
| H03K 5/00 | (2006.01) |

(52) U.S. Cl.
CPC ............. *H03K 5/135* (2013.01); *H04L 7/002* (2013.01); *H04L 7/0008* (2013.01); *H04L 7/0337* (2013.01); *H04L 27/01* (2013.01); *H03K 2005/00052* (2013.01); *H03K 2005/00065* (2013.01)

(58) Field of Classification Search
None
See application file for complete search history.

(56) References Cited

U.S. PATENT DOCUMENTS

| 8,063,686 | B1 | 11/2011 | Naviasky | |
|---|---|---|---|---|
| 8,558,597 | B2 | 10/2013 | Agrawal | |
| 9,160,345 | B1* | 10/2015 | Gorecki | H03K 5/135 |
| 9,876,489 | B1* | 1/2018 | Casey | H03K 5/1515 |
| 2013/0207708 | A1* | 8/2013 | Agrawal | H04L 27/01 |
| | | | | 327/237 |

* cited by examiner

*Primary Examiner* — Cassandra Cox
(74) *Attorney, Agent, or Firm* — Winston Hsu

(57) ABSTRACT

A phase interpolator includes a current generating circuit, a current controlling circuit and a signal generating circuit, wherein the current generating circuit is arranged to generate a current; and the current controlling circuit is arranged to generate a control signal to the current generating circuit to control a current value of the current. The signal generating circuit includes a capacitor, wherein the signal generating circuit generates a phase interpolation signal by using the capacitor to receive the current, wherein a phase of the phase interpolation signal is varied according to the current.

14 Claims, 5 Drawing Sheets

PHASE INTERPOLATOR AND CLOCK GENERATING METHOD

BACKGROUND OF THE INVENTION

1. Field of the Invention

The present invention relates to a phase interpolator and a clock generating method.

2. Description of the Prior Art

Clock signals with different phases generated by conventional phase interpolator will not be uniform due to differential loading, which may cause jitter. In addition, conducting time difference of the current-controlled switches for the conventional phase interpolator is large when the interpolator operates under different frequencies. This may cause circuit abnormal operation in certain frequency bands.

SUMMARY OF THE INVENTION

One of the objectives of the present invention is to provide a phase interpolator and a clock generating method to solve the above-mentioned problems.

According to an embodiment of the present invention, an exemplary phase interpolator is disclosed, comprising: a current generating circuit, a current controlling circuit and a signal generating circuit, wherein the current generating circuit is arranged to generate a current; the current controlling circuit is arranged to generate a control signal to the current generating circuit for controlling a current value of the current; and the signal generating circuit comprises a capacitor, and generates a phase interpolation signal, wherein a phase of the phase interpolation signal is varied according to the current value of the current.

According to an embodiment of the present invention, an exemplary clock generating method is disclosed, comprising: generating a current; generating a control signal to control a current value of the current; and receiving the current via a capacitor to generate a phase interpolation signal, wherein a phase of the phase interpolation signal is varied according to the current value of the current.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
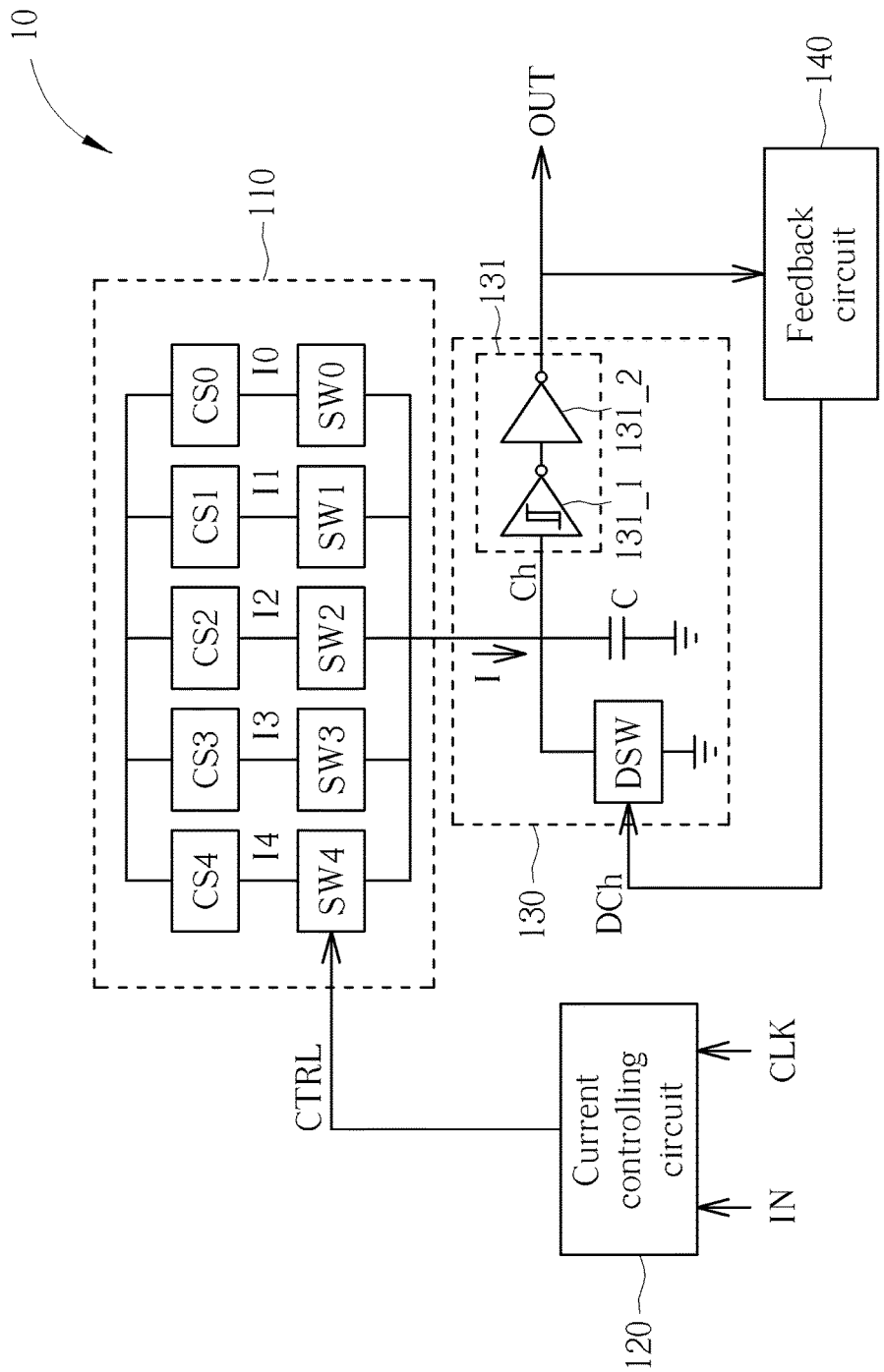
FIG. 1 is a diagram illustrating a phase interpolator according to an embodiment of the present invention.

FIG. 1 is a diagram illustrating a phase interpolator 10 according to an embodiment of the present invention. As shown in FIG. 1, the phase interpolator 10 comprises a current generating circuit 110, a current controlling circuit 120, a signal generating circuit 130 and a feedback circuit 140. The current generating circuit 110 comprises current sources CS0-CS4 arranged to generate currents I0-I4, respectively. The current generating circuit 110 controls switches SW0-SW4 via a set of control signals CTRL to control a value of a current I input to the signal generating circuit 130. The current generating circuit 110 comprises 5 sets of current sources (i.e. the current sources CS0-CS4) and the corresponding switches (i.e. the switches SW0-SW4). The control signal CTRL can be a 5 bits signal: namely, the control signal CTRL can be written as CTRL [0:4] to indicate the 5 bits comprised therein. In this embodiment, the number of current sources and switches in the current generating circuit 110 is only for illustrative purposes. In other embodiments, the current generating circuit 110 can comprise more or less than 5 sets of current sources and switches. In addition, in this embodiment, the current value of the current I1 is twice the current I0, i.e. I1=2I0; the current value of the current I2 is four times the current I0, i.e. I2=4I0; the current value of the current I3 is eight times the current I0, i.e. I3=8I0; and the current value of the current I4 is sixteen times the current I0, i.e. I4=16I0. This is only for illustrative purposes, however; the value of each current source is not limited by the present invention.

The current controlling circuit 120 is arranged to generate the control signal CTRL to the current generating circuit 110 according to an input signal IN and a clock signal CLK for controlling the current value of the current I input to the signal generating circuit 130. The signal generating circuit 130 comprises a capacitor C, a discharge switch DSW and a hysteresis circuit 131, wherein the capacitor C is arranged to receive the current I generated from the current generating circuit 110 in order to generate a trigger voltage signal Ch to the hysteresis circuit 131. As shown in FIG. 1, the hysteresis circuit 131 comprises an inverse Schmitt trigger 131_1 and an inverter 131_2. The hysteresis circuit 131 generates a phase interpolation signal OUT according to the trigger voltage signal Ch, and transmits the phase interpolation signal OUT to the feedback circuit 140. The feedback circuit 140 generates a discharge signal Dch to the discharge switch DSW of the signal generating circuit 130 according to the phase interpolation signal OUT to discharge the capacitor C. The detailed operation of the phase interpolation signal OUT will be discussed in the following paragraphs.

Referring to FIG. 1, the control signal CTRL generated by the current controlling circuit 120 controls the switches SW0-SW4 to determine the current value of the current I input to the signal generating circuit 130. The capacitor C starts charging after receiving the current I, and the trigger voltage signal Ch increases accordingly. When the trigger voltage signal Ch is greater than a predetermined threshold value of the inverse Schmitt trigger 131_1, the phase interpolation signal OUT reverses. The feedback circuit 140 then generates the discharge signal Dch to discharge the capacitor C according to the reverse of the phase interpolation OUT, resulting in the decrease of the trigger voltage signal Ch. When the trigger voltage signal Ch is smaller than another predetermined threshold value of the inverse Schmitt trigger 131_1, the phase interpolation signal OUT reverses again to complete a period of the phase interpolation signal OUT. In this invention, the current value of the current I input to the signal generating circuit 130 determines when the trigger voltage signal Ch is greater than the predetermined threshold value of the inverse Schmitt trigger 131_1: namely, the current value of the current I will determine the phase of the phase interpolation signal OUT. By charging the capacitor with the current stably generated by the current sources, the uniformity of the phase interpolation signal OUT can be increased, and the jitter can be reduced.

Figure 2:
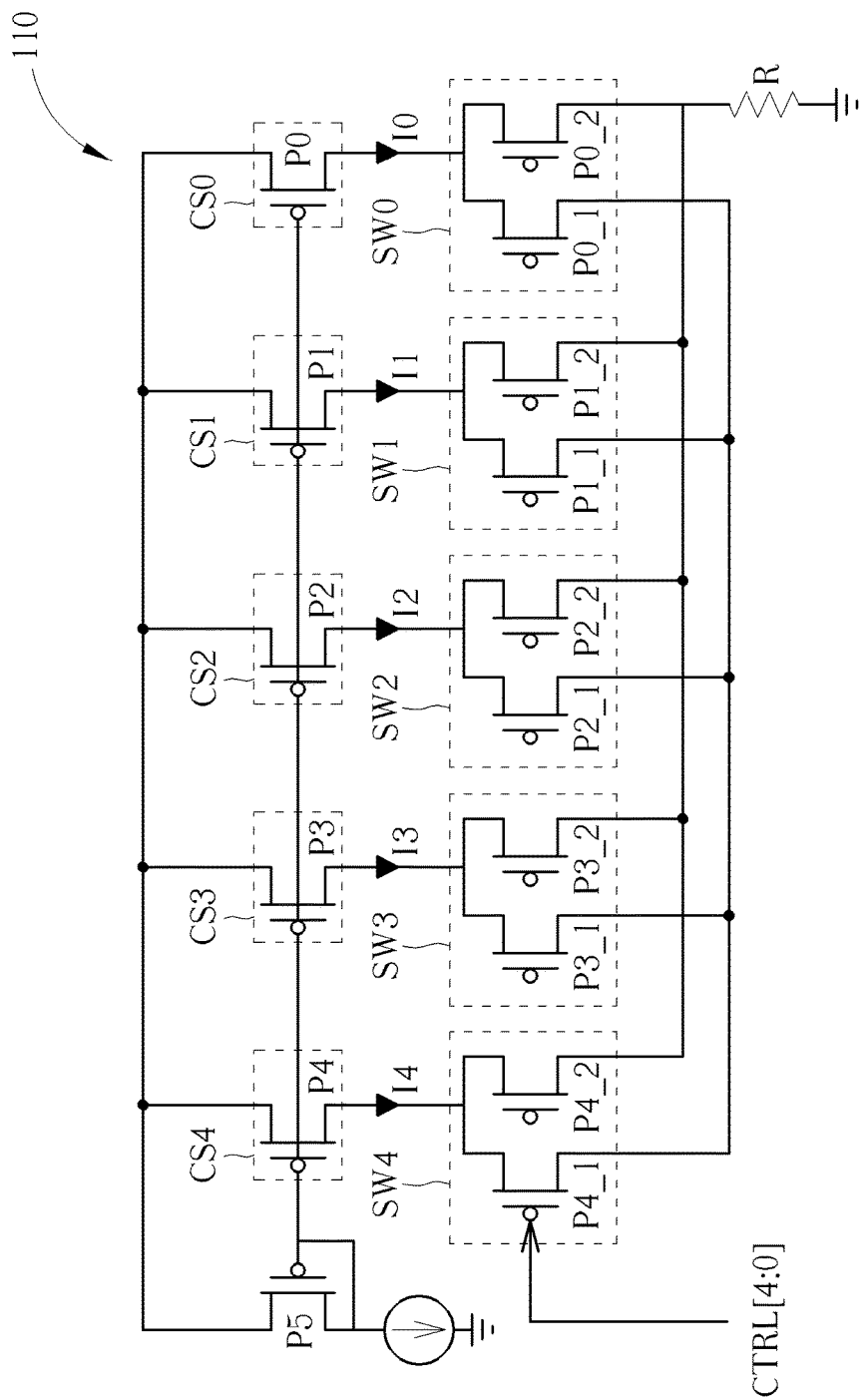
FIG. 2 is a diagram illustrating a current generating circuit according to the embodiment shown in FIG. 1.

FIG. 2 is a diagram illustrating a current generating circuit 110 according to the embodiment shown in FIG. 1. In this embodiment, a plurality of current mirrors is utilized to implement the current sources CS0-CS4. As shown in FIG. 2, the current generating circuit 110 comprises a plurality of transistors P0-P5. In this embodiment the plurality of transistors are P-type Metal-Oxide-Semiconductor Field-Effect Transistors (PMOSFETs), wherein the transistors P5 and P0 constitute the current source CS0, the transistors P5 and P1 constitute the current source CS1, the transistors P5 and P2 constitute the current source CS2, the transistors P5 and P3 constitute the current source CS3, and the transistors P5 and P4 constitute the current source CS4. Those skilled in the art should understand that the currents I0-I4 can be easily adjusted by adjusting the size of the transistors P0-P4. In this embodiment, the switches SW0-SW4 are also implemented by a plurality of transistors. Taking the switch SW4 as an example, the switch SW4 comprises a transistor P4_1 to receives the fifth bit of the control signal CTRL[0:4] from the current controlling circuit 120 in order to control the switch SW4. Likewise, the switches SW0-SW3 comprise transistors P0_1-P3_1 respectively, to receive the first bit to the fourth bit of the control signal CTRL[0:4] for controlling the switches SW0-SW3. As shown in FIG. 2, the switch SW4 further comprises a transistor P4_2 for receiving an inversion of the control signal CTRL[0:4], i.e. when the control signal CTRL[4:0] controls the transistor P4_1 of the switch SW4 to be closed, the transistor P4_2 should be opened simultaneously. It should be noted that the transistor P4_2 is optional in this invention. Likewise, the switches SW0-SW3 further comprise transistors P0_2-P3_2 for receiving the inversion of the control signal CTRL [0:4] from the current controlling signal 120. For example, when the control signal CTRL[0:4] controls the transistors P0_1, P2_1 and P4_1 to be closed, the current I contains the currents I0, I2 and I4 at this timing, and the switches SW1 and SW3 receive the inversion of the control signal CTRL [0:4] for conducting the transistors P1_2 and P3_2. Therefore, the currents I1 and I3 flow into a resistor R of the current generating circuit 110. It should be noted that the implementation of the current sources and the switches are not limited by the present invention. Those skilled in the art should easily understand there are other possible implementations for both the current sources and the switches.

Figure 3:
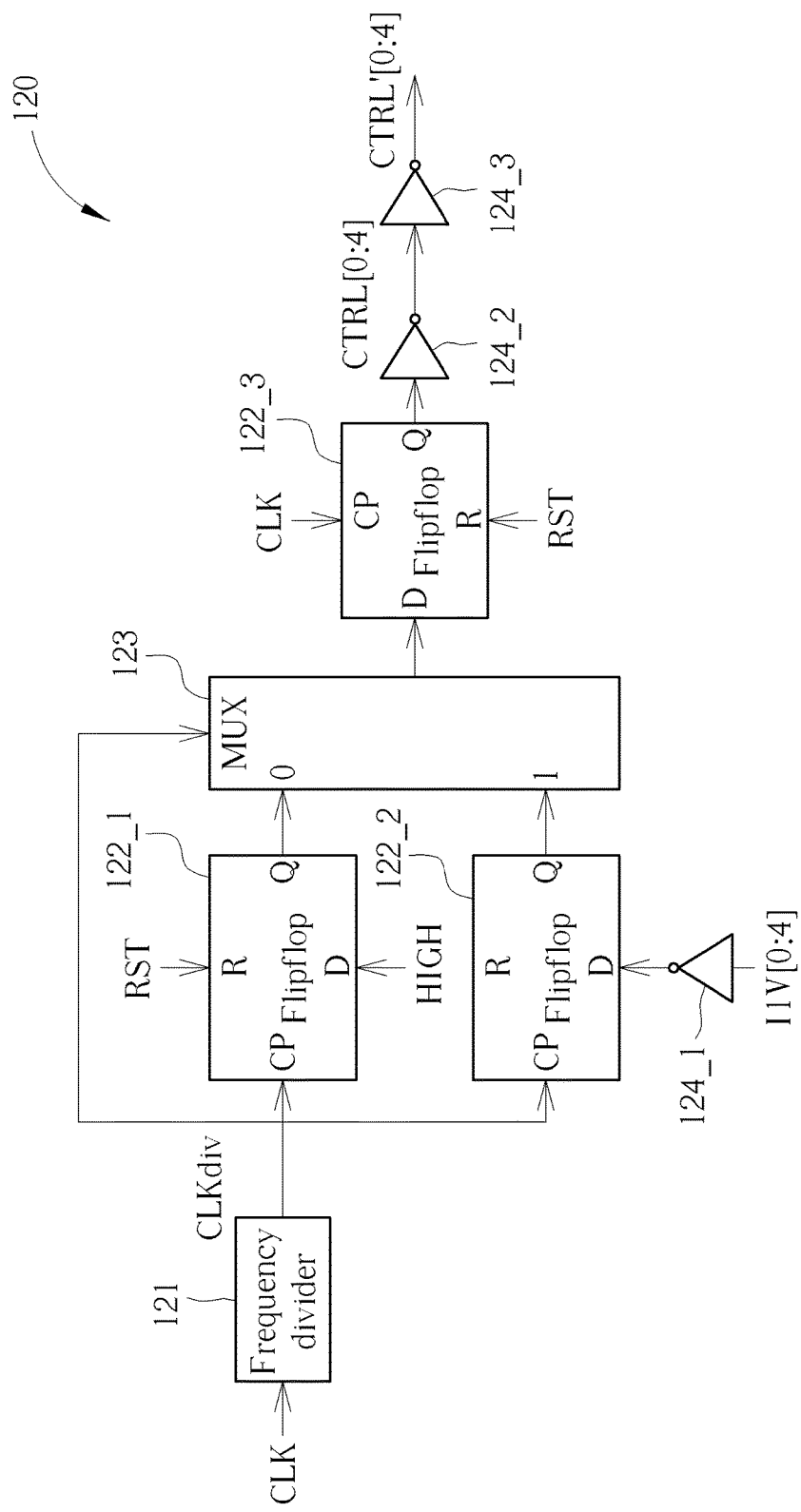
FIG. 3 is a diagram illustrating a current controlling circuit according to the embodiment shown in FIG. 1.

FIG. 3 is a diagram illustrating a current controlling circuit 120 according to the embodiment shown in FIG. 1. As shown in FIG. 3, the current controlling circuit 120 comprises a frequency divider 121, flip-flops 122_1, 122_2 and 122_3, a multiplexer 123 and inverters 124_1, 124_2, and 124_3, wherein the frequency divider 121 receives the clock signal CLK to generate a frequency divided clock signal CLKdiv, and transmits it to the backend to drive the flip-flops 122_1, 122_2 and the multiplexer 123. The flip-flop 122_1 receives a logic 'high' value (i.e. logic value '1' shown as HIGH in FIG. 3), and transmits it to an input of the multiplexer 123 according to the frequency divided clock signal CLKdiv while the flip-flop 122_2 receives the inversion of the input signal IN via the inverter 124_1, and transmits it to another input of the multiplexer 123 according to the frequency divided clock signal CLKdiv. The input signal IN can be written as IN[0:4] while taking 5 bits as an example. The multiplexer 123 selectively outputs the logic high value HIGH or the input signal IN[4:0] to the flip-flop 122_3 according to the value of the frequency divided clock signal CLKdiv. If the multiplexer 123 outputs the input signal IN[0:4] to the flip-flop 122_3, the inverter 124_2 considers the input signal IN[0:4] as the control signal CTRL[0:4] and transmits it to the switches SW0-SW4. As described in the embodiment of FIG. 2, the inverter 124_3 generates the inversion of the control signal CTRL[0:4] (i.e. the inverse control signal CTRL'[0:4] shown in FIG. 3) to the switches SW0-SW4 according to the control signal CTRL[0:4]. Each of the flip-flops 122_1-122_3 comprises an input terminal (the D terminal shown in figure), an output terminal (the Q terminal shown in the Figure) and a clock signal terminal (the CP terminal shown in the Figure). In addition, each of the flip-flops 122_1 and 122_3 further receives a reset signal RST at a reset terminal (the R terminal shown in the Figure) to reset the operating status. Those skilled in the art should easily understand the name and function of each terminal of the flip-flop.

Figure 4:
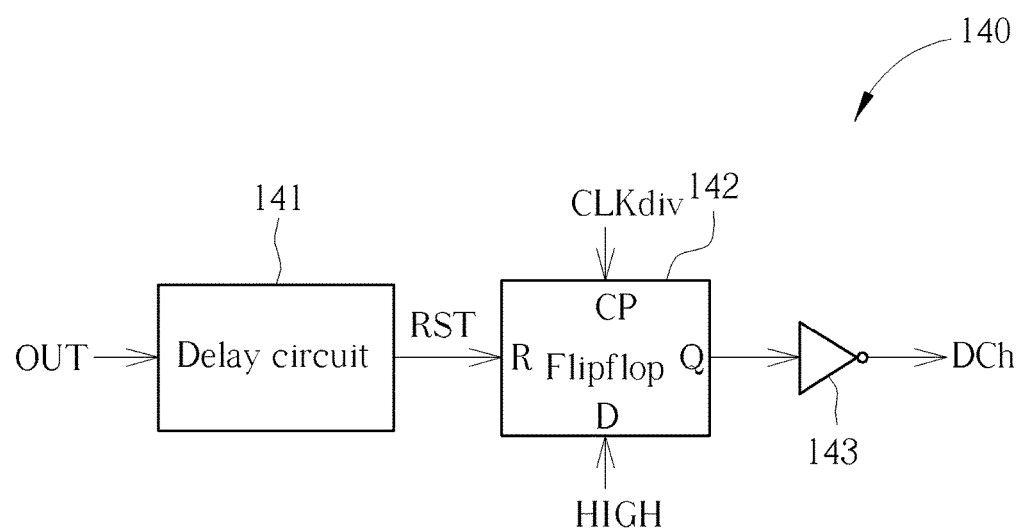
FIG. 4 is a diagram illustrating a feedback circuit according to the embodiment shown in FIG. 1.

FIG. 4 is a diagram illustrating a feedback circuit 140 according to the embodiment shown in FIG. 1. As shown in FIG. 4, the feedback circuit 140 comprises a delay circuit 141, a flip-flop 142 and an inverter 143, wherein the delay circuit 141 receives the phase interpolation signal OUT to generate the reset signal RST, and the flip-flop 142 receives the logic high value HIGH according to the frequency divided clock signal CLKdiv, transmits it to the inverter 143 to output the discharge signal DCh, and resets the operating status thereof according to the reset signal RST. It should be noted that, in this embodiment, the delay circuit 141 can be implemented by a plurality of buffers; however, this is only for illustrative purposes. The implementation of the delay circuit 141 is not limited by the present invention. In practice, the time delay of the delay circuit 141 is based on a designer's requirements.

Figure 5:
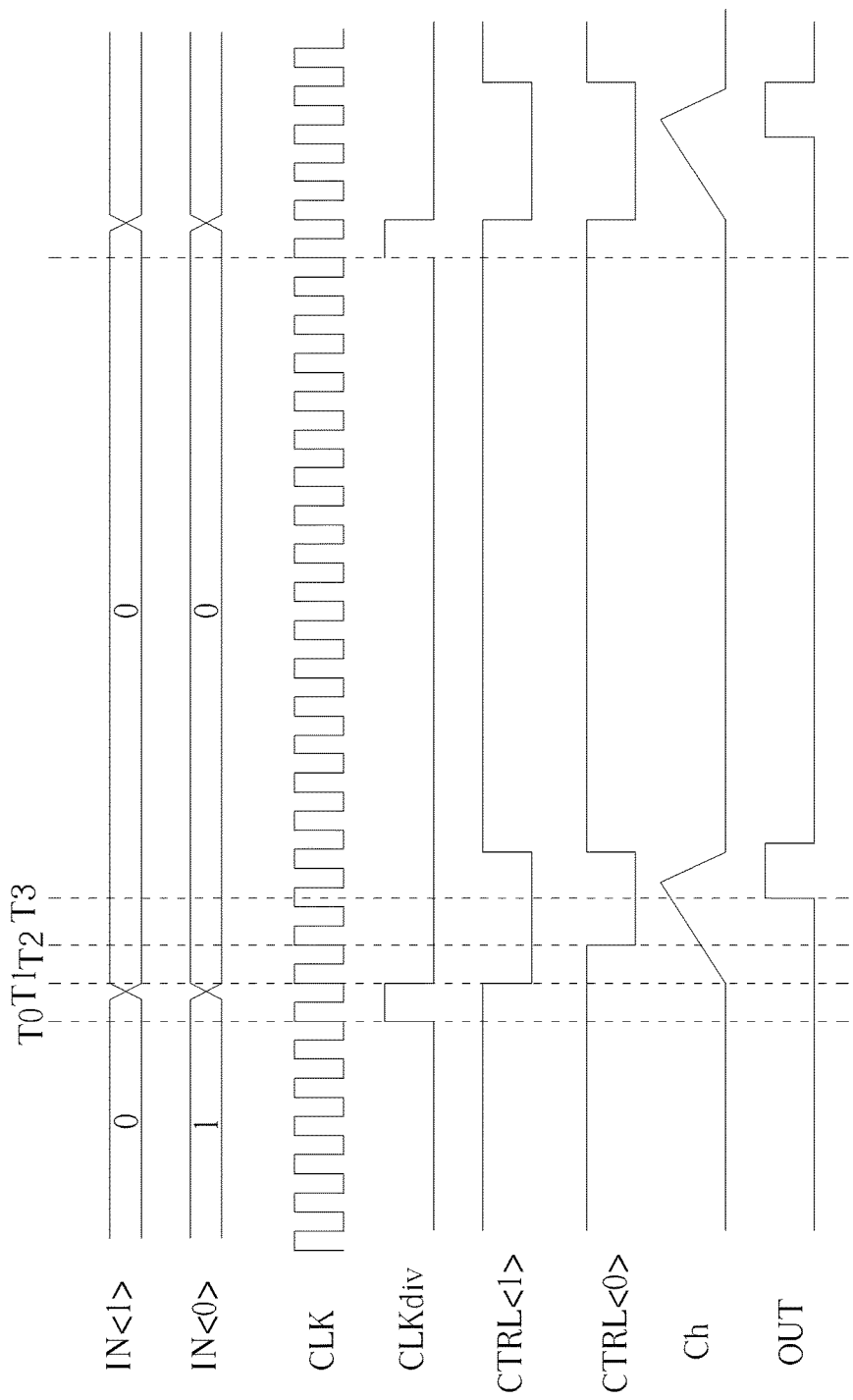
FIG. 5 is a diagram illustrating signal waveforms according to an embodiment of the present invention.

FIG. 5 is a diagram illustrating signal waveforms according to an embodiment of the present invention. As shown in FIG. 5, only two bits (i.e. IN<0> and IN<1>) of the input signal IN are depicted. At the timing T0, the input signal IN<0> is 1 while the input signal IN<1> is 0. Refer to FIG. 1 to FIG. 4 along with FIG. 5. The frequency divider 121 performs frequency division upon the clock signal CLK, wherein the time period for the generated frequency divided clock signal CLKdiv being logic high (i.e. the logic value '1') is one completed period for the clock signal CLK. The frequency divided clock signal CLKdiv is then transmitted to the flip-flops 122_1, 122_2 and the multiplexer 123. At the timing T0, the multiplexer 123 selects the output of the flip-flop 122_2 (i.e. the inversion of the input signal IN), and transmits it to the flip-flop 122_3; At the timing T1 the flip-flop 122_3 transmits the inversion of the input signal IN to the inverter 124_1 to generate the control signal CTRL. At this timing, the control signal CTRL<0> is 1 while the control signal CTRL<1> is 0 due to the inverter 124_2, wherein the control signals CTRL<0> and CTRL<1> are respectively transmitted to the switches SW0 and SW1 of the current generating circuit 110 for controlling the switch SW0 to be opened and the switch SW1 to be closed. At this timing, the current I input to the capacitor C is 2I0 generated from the current source CS1. The capacitor C is charged by the current I to increase the trigger voltage signal Ch. At the same time (timing T1), the multiplexer 123 selects the output of the flip-flop 122_1 and transmits the logic high value to the flip-flop 122_3; at timing T2, the flip-flop 122_3 transmits the logic high value HIGH to the inverter 124_2 to generate the control signal CTRL. The control signals CTRL<0> and CTRL<1> are both 0 due to the inverter 124_2, and are transmitted to the switches SW0 and SW1 of the current generating circuit 110 for controlling the switches SW0 and SW1 to be closed. At this timing, the current I input to the capacitor C is I0+2I0 generated from the current sources CS0 and CS1. At the timing T3, the trigger voltage signal Ch is greater than the predetermined threshold value of the inverse Schmitt trigger 131_1 to make the phase interpolation signal OUT reverse. At this timing, the feedback circuit 140 generates the rest signal RST according to the reverse of the phase interpolation signal OUT to reset the flip-flop 142 to make the discharge switch DSW discharge the capacitor C according to the discharge signal Dch. The trigger voltage signal Ch decreases accordingly. When the trigger voltage signal Ch is smaller than the other predetermined threshold value of the inverse Schmitt trigger 131_1, the phase interpolation signal OUT reverses again to complete one operation for the phase interpolation signal OUT. According to FIG. 5 and the operation described above, the input signal IN determines the current value of the current I, which indirectly determines when the phase interpolation signal OUT reverses. By using the current sources to charge the capacitor C and the logic gates to discharge the capacitor C for increasing the uniformity of the phase interpolation signal OUT, the jitter will also be decreased.

The above operation can also be described mathematically. Refer to FIG. 5 again. At the timing T1, the current used for charging the capacitor C is $(31-n)*I0$, where n is the value of the input signal IN. At the timing T2, because all the switches are closed, the current for charging the capacitor C is 31I0, and the amount of charge from the timing T1 to the time when the trigger voltage signal Ch reaches the predetermined threshold value of the inverse Schmitt trigger 131_1 can be written using the following equation:

$$(31-n)*I0*T+31*I0*(Tn-T)=Vth*C$$

where T is the period of the clock signal CLK, Vth is the predetermined threshold value of the inverse Schmitt trigger 131_1, and Tn is the delay for the phase interpolation signal OUT when the input signal is n.

Because the capacitor C, the predetermined threshold value Vth, the current I0 and the period T will have the same value in two consecutive charging processes, the following equation is acquired:

$$Tn=T0+(n/31)*T$$

It can be deduced that each time the input signal increases by 1, the output of the phase interpolator 10 will increase the delay amount by T/31.

Briefly summarized, the present invention discloses a phase interpolator using current sources to charge the capacitor for implementing output clock signals with different phases. By checking the phase interpolation signal of the phase interpolator to automatically adjust the desired charging time to adapt different frequency bands, the uniformity of the phase interpolator can be increased while the jitter of the phase interpolation signal can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A phase interpolator, comprising:
   a current generating circuit, arranged to generate a current;
   a current controlling circuit, arranged to generate a control signal to the current generating circuit to control a current value of the current;
   a signal generating circuit, comprising:
      a capacitor, wherein the signal generating circuit receives the current via the capacitor to generate a trigger voltage signal; and
      a hysteresis circuit, for receiving the trigger voltage signal and generating a phase interpolation signal according to the trigger voltage signal;
   wherein a phase of the phase interpolation signal is varied according to the current value of the current.

2. The phase interpolator of claim 1, further comprising:
   a feedback circuit, arranged to generate a discharge signal to a switch according to the phase interpolation signal for discharging the capacitor.

3. The phase interpolator of claim 2, wherein when the trigger voltage signal is greater than a predetermined threshold value, the phase interpolation signal reverses, and the feedback circuit generates the discharge signal to the switch for discharging the capacitor to decrease the trigger voltage signal.

4. The phase interpolator of claim 2, wherein the hysteresis circuit comprises a Schmitt trigger or a hysteresis comparator.

5. The phase interpolator of claim 2, wherein the feedback circuit comprises:
   a delay circuit, arranged to receive and delay the phase interpolation signal, and generate a delay signal; and
   a flip-flop, arranged to generate the discharge signal to the switch to discharge the capacitor according to the delay signal.

6. The phase interpolator of claim 1, wherein the current generating circuit comprises:
   at least a current source; and
   at least a charge switch, coupled to the current source;
   wherein the current generating circuit controls the charging switch according to the control signal to control the current received by the capacitor.

7. The phase interpolator of claim 1, wherein the current controlling circuit further comprises:
   at least a flip-flop, arranged to receive a clock signal and an input signal, wherein the control signal is generated according to the input signal and the clock signal.

8. A clock generating method, comprising:
   generating a current;
   generating a control signal to control a current value of the current;
   receiving the current via a capacitor, comprising:
      generating a trigger voltage signal to a hysteresis circuit according to the received current; and
      utilizing the hysteresis circuit to generate a phase interpolation signal according to the trigger voltage signal, wherein a phase of the phase interpolation signal is varied according to the current value of the current.

9. The clock generating method of claim 8, further comprising:

generating a discharge signal to a switch according to the phase interpolation signal for discharging the capacitor.

10. The clock generating method of claim 9, further comprising:

when the trigger voltage signal is greater than a predetermined threshold value, the phase interpolation signal reverses and the discharge signal is generated to the switch to discharge the capacitor for decreasing the trigger voltage signal.

11. The clock generating method of claim 9, wherein the hysteresis circuit comprises a Schmitt trigger or a hysteresis comparator.

12. The clock generating method of claim 9, wherein the step of generating a discharge signal to the switch according to the phase interpolation signal to discharge the capacitor comprises:

receiving and delaying the phase interpolation signal, and generating a delay signal; and generating the discharge signal to the switch for discharging the capacitor according to the delay signal.

13. The clock generating method of claim 8, further comprising:

controlling at least a charging switch coupled to at least a current source according to the control signal to control the current received by the capacitor.

14. The clock generating method of claim 8, further comprising:

utilizing at least a flip-flop to receive a clock signal and an input signal, wherein the control signal is generated according to the input signal and the clock signal.

* * * * *